US012792463B2

(12) United States Patent
Ayyapureddi

(10) Patent No.: US 12,792,463 B2
(45) Date of Patent: Nov. 10, 2026

(54) APPARATUSES AND METHODS FOR SELECTABLE EXPANSION OF ERROR CORRECTION CAPABILITY

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 260 days.

(21) Appl. No.: 18/588,373

(22) Filed: Feb. 27, 2024

(65) Prior Publication Data

US 2024/0296096 A1 Sep. 5, 2024

Related U.S. Application Data

(60) Provisional application No. 63/487,671, filed on Mar. 1, 2023.

(51) Int. Cl.

| | |
|---|---|
| ***G06F 11/10*** | (2006.01) |
| ***G06F 11/00*** | (2006.01) |
| ***G11C 11/56*** | (2006.01) |

(52) U.S. Cl.

CPC ...... *G06F 11/1096* (2013.01); *G06F 11/1048* (2013.01); *G11C 11/56* (2013.01)

(58) Field of Classification Search

CPC ............. G06F 11/1048; G06F 11/1096; G06F 11/1068; G06F 11/1072; G06F 11/1044; H03M 13/00; G11C 11/5628; G11C 16/0483; G11C 16/10; G11C 7/1006; G11C 11/5642; G11C 29/78; G11C 2211/5641

See application file for complete search history.

(56) References Cited

U.S. PATENT DOCUMENTS

| | | | | |
|---|---|---|---|---|
| 5,761,222 | A | 6/1998 | Baldi | |
| 7,739,576 | B2 | 6/2010 | Radke | |
| 9,032,269 | B2 * | 5/2015 | Sharon | G11C 11/5628 714/763 |
| 9,235,468 | B2 | 1/2016 | Mao | |
| 9,577,673 | B2 | 2/2017 | Parthasarathy et al. | |
| 10,067,823 | B2 | 9/2018 | Singhai et al. | |
| 10,318,381 | B2 | 6/2019 | Eno et al. | |
| 10,432,232 | B2 | 10/2019 | Zamir et al. | |
| 11,675,662 | B2 * | 6/2023 | Schaefer | G11C 7/1006 714/755 |

(Continued)

OTHER PUBLICATIONS

U.S. Appl. No. 18/588,402 titled "Apparatuses and Methods for Read Commands With Different Levels of ECC Capability" filed Feb. 27, 2024, pp. all pages of the application as filed.

*Primary Examiner* — Justin R Knapp

(74) *Attorney, Agent, or Firm* — Dorsey & Whitney LLP

(57) ABSTRACT

Apparatuses, systems, and methods for selectable expansion of error correction capability. A memory includes an error correction code (ECC) circuit which generates a default number of parity bits based on written data, and uses those parity bits to correct error(s) in the data. A setting of the memory may specify some number of extra bits of parity. When enabled the ECC circuit may generate parity include the default parity and the extra parity. The default parity is stored in an ECC column plane. The extra parity is stored in the data column planes. When the extra parity is enabled, the ECC circuit may detect/correct more bits of error in the data.

18 Claims, 6 Drawing Sheets

(56) References Cited

U.S. PATENT DOCUMENTS

| | | | | |
|---|---|---|---|---|
| 11,681,578 | B2 * | 6/2023 | Ishikawa | G06F 11/1068<br>714/764 |
| 12,099,409 | B2 | 9/2024 | Oboukhov et al. | |
| 12,292,798 | B2 * | 5/2025 | Ayyapureddi | G06F 11/1048 |
| 2013/0024748 | A1 * | 1/2013 | Sharon | G06F 11/1072<br>711/E12.001 |
| 2017/0255512 | A1 | 9/2017 | Zamir et al. | |
| 2022/0368354 | A1 | 11/2022 | Lu | |
| 2023/0393937 | A1 | 12/2023 | Oboukhov et al. | |
| 2024/0296095 | A1 * | 9/2024 | Ayyapureddi | G06F 11/1076 |

* cited by examiner

APPARATUSES AND METHODS FOR SELECTABLE EXPANSION OF ERROR CORRECTION CAPABILITY

CROSS REFERENCE TO RELATED APPLICATION(S)

This application claims the benefit under 35 U.S.C. § 119 of the earlier filing date of U.S. Provisional Application Ser. No. 63/487,671 filed Mar. 1, 2023, the entire contents of which are hereby incorporated by reference in their entirety for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). During an access operation, an access command may be received along with address information which specifies which memory cells should be accessed.

Some memories may include on-device error correction. In such devices, the memory array may generate parity bits when data is written to the array, and then during a read using that parity to check the data for errors. The number of errors which can be detected and/or corrected may be based, in part on the number of parity bits. However, these parity bits may take up space in the array. There may thus be a trade-off between the amount of error correction which can be performed and the amount of storage available in the array.

DETAILED DESCRIPTION

Figure 1:
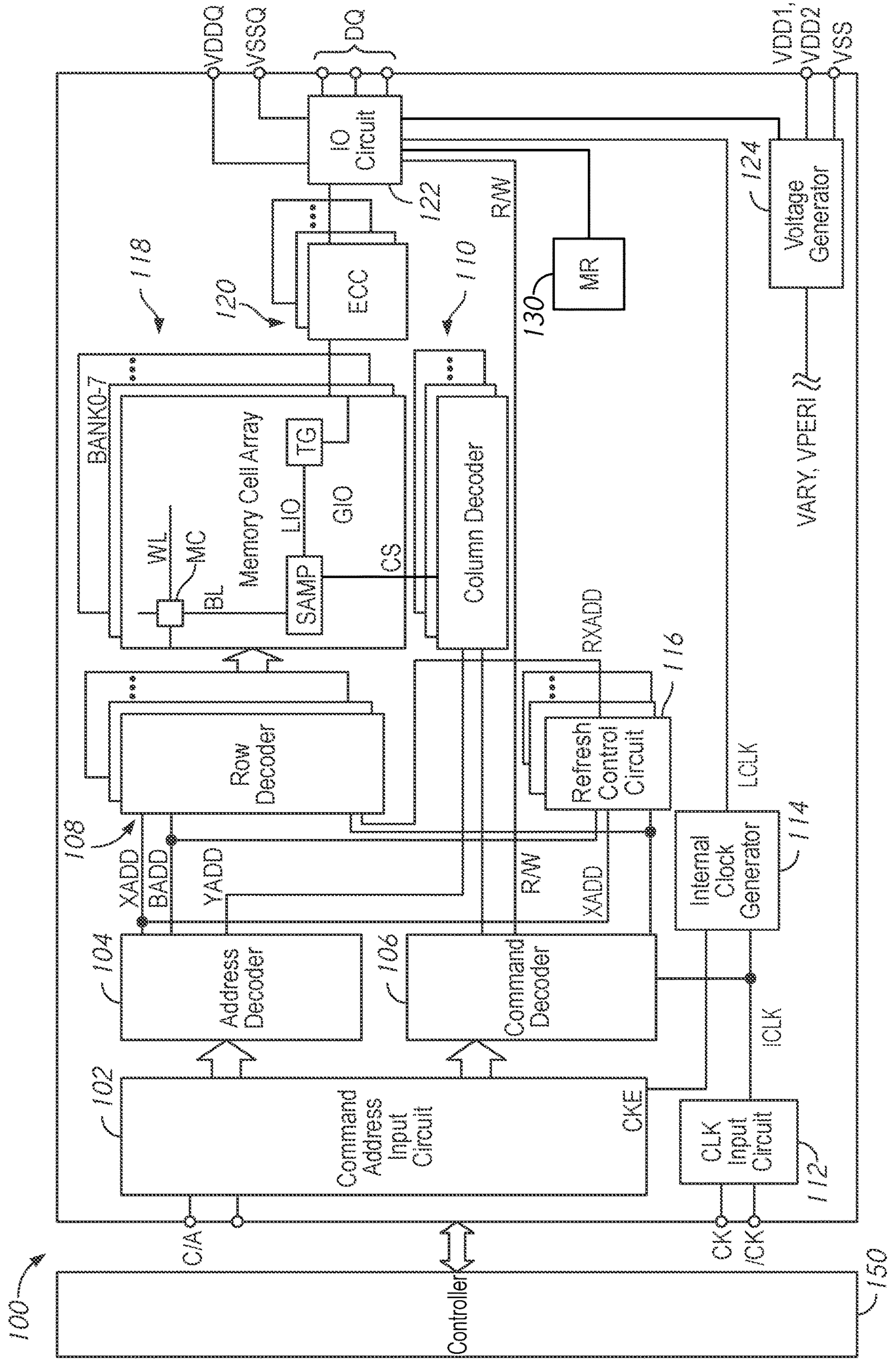
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). The columns may be grouped together into column planes, and a column select (CS) signal may be used to select a set of columns within each of the active column planes to provide data. During a write operation, the device receives data, and an error correction code (ECC) engine generates parity bits based on the data. The data and parity is then written to a word line specified by a row address and to bit lines selected by a column address. During a read operation, the data and parity are read out to the ECC engine, which uses the data and parity to determine if there are errors and/or locate and correct one or more errors in the data. The corrected data is then output from the device.

Memories will generally include a set of data column planes which are used to store data, and an extra column plane which is used to store parity bits. The error correction scheme which is implemented may thus partly depend on how many bits of parity are stored in the extra column plane. For example, a memory may generally read/write 8 bits at a time from each column plane, and so there may be 8 parity bits associated with the data (e.g., from 16 data column planes for 128 bits of data) which may allow the ECC engine to perform single error correction (SEC). However, some users of the memory (e.g., customers) may desire increased protection of their data at the cost of more space.

The present disclosure is drawn to apparatuses, systems, and methods for selectable expansion of error correction capability. A memory device may include various settings, for example as saved in a mode register. This mode register may include settings which allow a user to specify how many additional parity bits should be generated on top of a default number of parity bits. For example a user may specify no additional bits and the memory may operation in SEC format as normal. In another example, if the memory normally generates A parity bits based on X data bits, then the mode register may have a setting which adds B additional parity bits for a total of Y=(A+B) parity bits. For example, the memory normally receives 128 data bits and generates 8 parity bits (e.g., A=8 bits), then the mode register may specify 2 additional bits (e.g., B=2 bits) and the ECC engine may generate 10 parity bits (e.g., Y=10 bits) based on the 128 data bits. The increased number of parity bits may allow for greater protection, such as a single error correction, double error detection (SECDED) scheme.

The additional parity bits may be stored outside the parity column plane. For example, the default A parity bits may represent a maximum number of bits which can be accessed at one time from a column plane (e.g., 8 bits). The A parity bits may be stored in the parity column plane as normal. Any additional bits (e.g., B extra bits) may be stored in the data column planes. For example, when data is written to the device, the device may write the X data bits and a first portion of the parity bits (e.g., A) to the memory array as part of a first access operation, with the X data bits stored in the data column planes and the A parity bits stored in the parity column plane. The memory may then perform a second access operation to perform a read, modify, write cycle on a codeword of additional information stored in the data column planes so that it includes the B parity bits. During an example read operation, the codeword of additional information is read out in a first access operation and the B extra parity bits are extracted, then during a second access operation the X data bits and A default parity bits are read out, the parity is joined together to reform the Y parity bits (e.g., A+B) and the ECC engine may then use the X data bits and Y parity bits to detect and/or correct errors.

In some embodiments, the memory may also store metadata associated with the X data bits. The metadata may be stored in a manner generally similar to the additional parity bits. In some embodiments, the mode register may specify a number of additional bits to be stored, and a then a second register may specify how many of those bits should be used as additional parity bits (with a remainder used as metadata).

As used herein, the term data may represent any bits of information that the controller wishes to store and/or retrieve from the memory. The term metadata may represent any bits of information about the data which the controller writes to and/or receives from the memory. For example, the metadata may be information that the controller generates about the data, about how or where the data memory is stored in the memory, about how many errors have been detected in the data, etc. The data and the metadata together represent information written to the memory by a controller and then also read from the memory by the controller, with the data and metadata differing in content and how they are generated in that the metadata is based on information about the data. The term parity may represent any bits generated by an error correction circuit of the memory based on the data, metadata, or combinations thereof. The parity may generally stay within the memory. In some embodiments, the amount of data and/or metadata retrieved as part of a single access operation may represent a set of bits which are a fragment of a larger piece of information. For example, the metadata bits retrieved as part of a single access operation (e.g., 4 bits) may not have any meaning on their own, but may have meaning when combined with sets of metadata bits retrieved as part of other access operations (e.g., to other memory arrays and/or to the same array at different times).

FIG. 1 is a block diagram of a semiconductor device according an embodiment of the disclosure. The semiconductor device 100 may be a semiconductor memory device, such as a DRAM device integrated on a single semiconductor chip. The device may be operated by a controller 150, such as a processor.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank.

The bit lines BL are coupled to a respective sense amplifier (SAMP). Read data from the bit line BL is amplified by the sense amplifier SAMP, and transferred to an ECC circuit 120 over local data lines (LIO), transfer gate (TG), and global data lines (GIO). Conversely, write data outputted from the ECC circuit 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The decoded row address XADD may be used to determine which row should be opened, which may cause the data along the bit lines to be read out along the bit lines. The column decoder 110 may provide a column select signal CS, which may be used to determine which sense amplifiers provide data to the LIO. The address decoder 104 may also supply a decoded bank address BADD, which may indicate the bank of the memory array 118 containing the decoded row address XADD and column address YADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide signals which indicate if data is to be read, written, etc.

The memory includes a mode register 130 which may be used to control various aspects of the memory 100. For example, the mode register 130 may include one or more setting registers which specify various settings of the memory. The controller 150 may perform a mode register write operation to set values of one or more setting registers. The controller 150 may perform a mode register read operation to check the value of various registers, which may contain information about various settings, conditions of the memory (e.g., temperature), error reports (e.g., error check and scrub information), other information, or combinations thereof.

The mode register 130 includes a metadata register which specifies how many bits of metadata are associated with the data written the memory array. The metadata register may specify 0 bits of metadata, in which case the feature may be disabled. The mode register 130 includes an additional parity bit register which specifies how many additional parity bits should be used alongside the default parity bits. For example, the additional parity bit register may specify 0 (in which case the feature is disabled), 1 or 2 additional parity bits. More additional parity bits may be specified in other example embodiments.

In some embodiments, the metadata register may specify a number of additional bits, and then the additional parity bit register may specify how many of those additional bits are to be used as parity bits. For example, the metadata register may specify 6 additional bits, and the additional parity bit register may specify that 2 of those additional bits are to be used as additional parity bits for a total of 4 metadata bits and 2 additional parity bits. In another example, the metadata register may specify 1 bit, and the additional parity bit register may also specify 1 bit, in which case metadata may be disabled, and 1 additional parity bit may be used.

The device 100 may receive an access command which is a write command. When the write command is received, and a bank address, a row address and a column address are timely supplied with the write command by the controller 150, write data supplied to the data terminals DQ by the controller 150 are provided along the data bus and written to a memory cells in the memory array 118 corresponding to the row address and column address. The write command is received by the command decoder 106, which provides internal commands so that the write data along with any additional information (e.g., metadata and/or additional parity) is received by data receivers in the input/output circuit 122. If no additional information is enabled, the write data is supplied via the input/output circuit 122 to the ECC circuit 120. The ECC circuit generates a default number of parity bits based on the received data and the data and parity are provided by the ECC circuit 120 to the memory array 118 to be written into the memory cells MC which are specified by the row and column address.

If the mode register 130 enables one or more bits of additional information then a two-pass write operation is performed. The number of bits of data plus the number of bits of default parity may represent the maximum amount of information that can be stored in a single access operation. Accordingly, when additional information (e.g., metadata and/or additional parity) is specified, a second access may be used. During the first access, the ECC circuit 120 receives the data (and metadata if enabled) and generates a number of parity bits as specified by the mode register 130 (e.g., a default number of bits plus some number of additional bits). The additional bits (metadata and additional parity bits) are stored in a latch, while the data and default parity bits are written to the memory array. The second access operation may be a read/modify/write cycle, wherein the command decoder 106 and address decoder 104 issue commands to read a set of stored information from the memory array (e.g., from a different location along the same word line). The stored information may have its own parity bits, which are read out and along with the stored information and used to correct the stored information. The stored information may have an amount of parity based on the default number of parity bits, and may not be effected by the additional parity bits register. The stored information is then modified by overwriting a portion of the stored information with the additional information. The modified stored information is then written back to the memory array through the ECC circuit 120, which generates new associated parity based on the modified stored information.

The device 100 may receive an access command which is a read command. When a read command is received, and a bank address, a row address and a column address are timely supplied with the read command by the controller 150, read data is read from memory cells in the memory array 118 corresponding to the row address and column address. The read command is received by the command decoder 106, which provides internal commands so that read data and read parity bits from the memory array 118 is provided to the ECC circuit 120. The ECC circuit receives and the data and the parity bits from the array and detects and/or corrects errors in the data and metadata bits. The correct read data is provided along the data bus and output to outside from the data terminals DQ via the input/output circuit 122.

If the mode register specifies one or more bits of additional information, then a two pass access operation may be performed responsive to the read command. In the first access pass, the stored information may be retrieved along with its associated parity. The ECC circuit 120 locates/corrects and errors in the stored information and then the additional information associated with the data which is going to be read is extracted from the stored information. In a second access operation, the data and default parity are read out and rejoined with the additional parity. The ECC circuit 120 may then detect and/or correct errors in the data based on the parity (the additional parity and the default parity), and the corrected data may be output off the device. In some embodiments, the memory 100 may provide the controller 150 with one or more signals which indicate if an error was detected.

The use of the additional parity bits may allow for an increased protection of the data. For example, a read operation may retrieve 128 data bits, along with 8 default parity bits. Using this combination, the ECC circuit 120 may implement a single error correction (SEC) scheme, where up to one bit of error is located and corrected. However, if the mode register 130 enables an additional bit of parity, then a total of 128 data bits and 9 parity bits are used, which may enable a single error correction, double error detection (SECDED), scheme, where up to one error is corrected, but the ECC circuit 120 is also able to determine if there are two errors (but not correct them).

The device 100 includes refresh control circuits 116 each associated with a bank of the memory array 118. Each refresh control circuit 116 may determine when to perform a refresh operation on the associated bank. The refresh control circuit 116 provides a refresh address RXADD (along with one or more refresh signals, not shown in FIG. 1). The row decoder 108 performs a refresh operation on one or more word lines associated with RXADD. The refresh control circuit 116 may perform multiple types of refresh operation, which may determine how the address RXADD is generated, as well as other details such as how many word lines are associated with the address RXADD.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
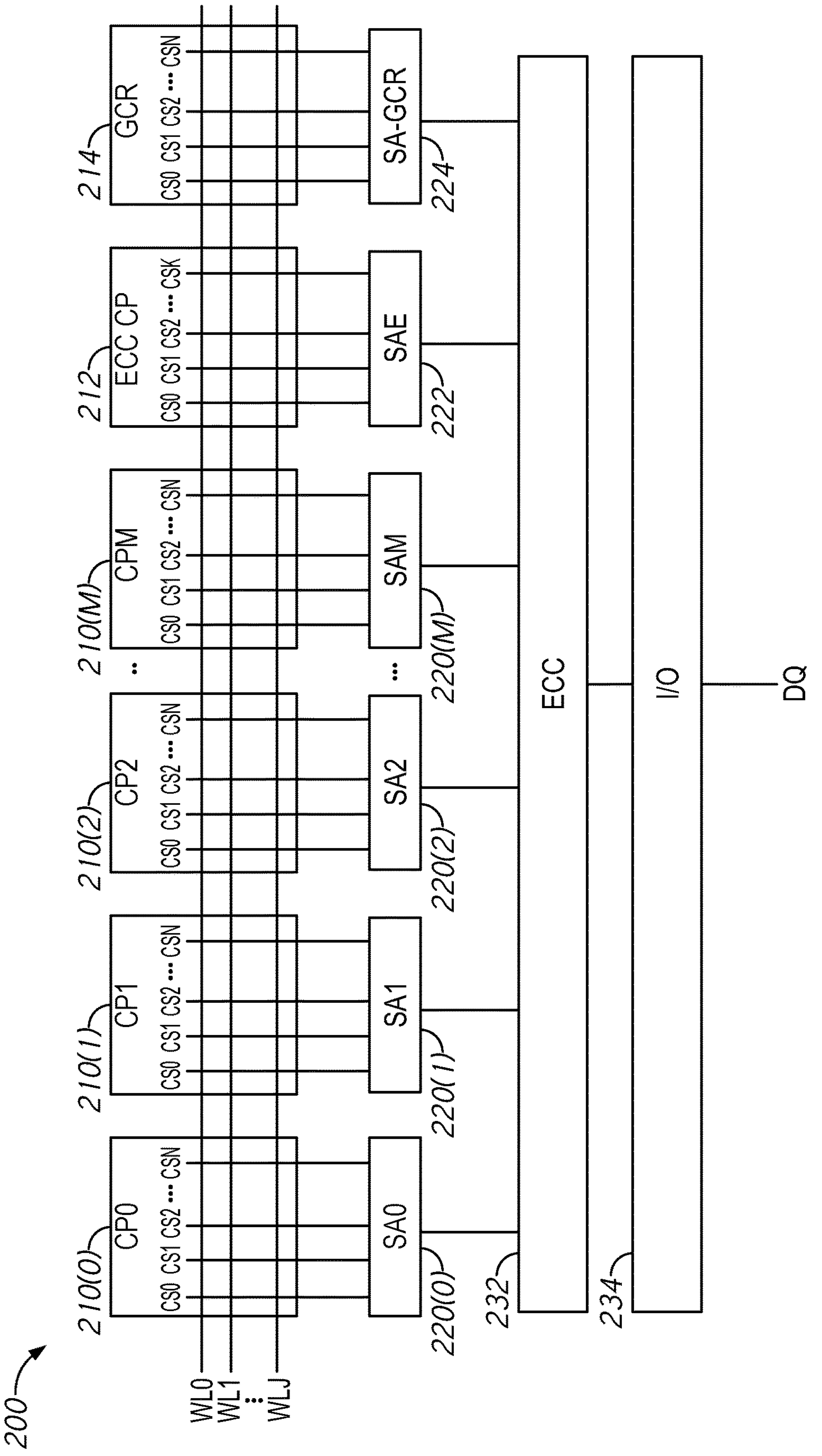
FIG. 2 is a block diagram of a memory device according to some embodiments of the present disclosure.

FIG. 2 is a block diagram of a memory device according to some embodiments of the present disclosure. The memory device 200 may, in some embodiments, represent a portion of the memory device 100 of FIG. 1. The view of FIG. 2 shows a portion of a memory array 210-214 and 220-224 which may be part of a memory bank (e.g., 118 of FIG. 1) along with selected circuits used in the data path such as the ECC circuit 232 (e.g., 120 of FIG. 1) and IO circuits 234 (e.g., 122 of FIG. 1). For clarity certain circuits and signals have been omitted from the view of FIG. 2.

The memory device 200 is organized into a number of column planes 210-214. Each of the column planes represents a portion of a memory bank. Each column plane 210-214 includes a number of memory cells at the intersection of word lines WL and bit lines. The word lines may be extend across multiple of the column planes 210-214. The bit lines may be grouped together into sets which are activated by a column select signal CS provided by a column decoder (e.g., 110 of FIG. 1).

For the sake of clarity, only a single vertical line is used to represent the bit lines of each column select set in a given column plane, however, there may be multiple bit lines accessed by each CS value in each column plane. For example, each vertical line may represent 8 bit lines, all accessed in common by a value of CS. As used herein, a 'value' of CS may refer to a decoded signal provided to sets of bit lines. So a first value may represent a first value of a multibit CS signal, or after decoding a separate binary signal (e.g., a signal line being active). For example, if the (predecoded) CS signal is 6 bit signal (e.g., with 64 values), then there may 64 different decoded CS signals.

The memory 200 includes a set of data column planes 210 as well as an extra column plane or ECC column plane 212. The extra column plane 212 may be used to store the default parity bits. In some embodiments, the memory 200 may also include an optional global column redundancy (GCR) column plane 214 . . . . In some embodiments, the GCR plane 214 may have fewer memory cell (e.g., fewer column select groups) than the data column planes 210. The GCR CP 214 includes a number of redundant columns which may be used as part of a repair operation. For example, if a value of the CS signal is identified as including defective memory cells in one of the data column planes 210, then the memory may be remapped such that the information which would have been stored in that column plane for that value of CS is instead stored in the GCR CP 214.

An example memory device 200 according to some embodiments of the present disclosure may include 16 data column planes 210(0)-210(15). Each of those data column planes 210 includes 64 sets of bit lines (e.g., CS sets) activated by a value of the column select signal, and each set of bit lines includes 8 bit lines. Accordingly, when a word line is opened responsive to a row address, and a column select signal is provided to each of the 16 column planes then 8 bits are accessed from each of the 16 column planes for a total of 128 bits. The column select signal is also provided to the ECC CP 212, which accesses an additional 8 bits of default parity associated with the 128 bits. If a repair has been performed, the GCR CP 214 may also be accessed and the information accessed in the GCR CP 214 may be swapped for the information accessed from the repaired CP (e.g., by multiplexing a GCR local input/output line onto the repaired LIO line). Accordingly, the maximum number of bits that can be retrieved as part of an access pass in the example memory device is 128 bits from the data column planes 210 (with 8 bits substituted from the GCR CP 214 if there has been a repair) along with 8 additional bits from the extra CP 212. For the sake of consistency, reference will generally be made throughout to these example values, however, it should be understood that embodiments of the present disclosure may have a different architecture, which involves more or fewer column planes, more or fewer bit lines per CS set, more or fewer, CS sets per column plane, and so forth.

A mode register (e.g., 130 of FIG. 1), not shown in FIG. 2, may be used for various amounts of additional information, such as metadata and extra parity bits, on the device 200. If additional information is disabled, then responsive to an access operation, then a single-pass access operation is performed where the row decoder may activate a word line (based on a received row address) and the column decoder activates a CS set in each CP 210 and 212 (and 214 if a repair has been performed) based on the received column address. If additional information is enabled, then a two-pass operation may be performed, where two access passes are performed, one of which accesses the memory cells which store the data and the default parity, and one of which accesses a codeword of additional information which includes the additional information (e.g., metadata and extra parity) associated with the data. An example write operation is described in more detail in FIG. 3. An example read operation is described in more detail in FIG. 4.

When additional information is enabled, the column decoder may generate two CS signals for each access operation (e.g., responsive to a received column address), one for the first access pass and one for the second access pass. In some embodiments, the same word line may be used for both access passes (e.g., both the data and its associated information may be stored in memory cells along a same word line). The codeword of additional information may include additional information associated with multiple data codewords (e.g., sets of 128 bits of data) along the row. Depending on how many bits of additional information are enabled, there may be multiple codewords of additional information along each row. Each codeword of additional information is stored in the data column planes 210, and each codeword of additional information, similar to the data codewords, has associated parity stored in the ECC CP 212.

In an example embodiment, if there are 4 additional bits of information (e.g., 2 metadata and two extra parity bits) enabled for each data codeword, and there are 16 column planes, each with 64 CS sets, each containing 8 bit lines, then data may be stored in CS0-CS61 of the data column planes 210, while additional information is stored in CS62-63 of the data column planes. The codewords of additional information may also have associated parity bits (e.g., a default number of parity bits) which may be stored in CS62-63 of the ECC CP 212. When a column address is received, during an access pass to access the data, the column decoder may provide a CS signal in the range of CS0-CS61, and during an access pass to access the additional information, the column decoder may provide a CS signal in the range of CS62-63. Other arrangements of data and additional information may be used in other example embodiments.

As described in more detail herein, the additional information may include extra parity bits, if that feature is enabled by the mode register. The extra parity bits may increase an amount of protection offered by the ECC circuit 232. For example, if the default amount of parity (e.g., 8 bits of parity for every 128 bits of data) enables SEC, then when extra parity is enabled, the ECC circuit 232 may perform SECDED on the data. Accordingly, the ECC circuit 232 may have optional components which are not enabled when the default number of parity bits are used, but which are enabled when extra parity is used. For example, the ECC circuit 232 may include a logic tree which combines inputs such as the data to generate parity bits. The logic tree may include a portion which generates extra parity bits and which is disabled when extra parity are not used. Similarly, the ECC circuit 232 may include additional inputs for the extra parity bits used during a read operation which are unused when extra parity bits are not enabled.

In some embodiments, the operation of the ECC circuit 232 may vary between access passes of a single access operation when extra parity bits are enabled. For example, even when extra parity is enabled, the codeword of additional information may still use the default amount of parity without any extra parity bits. For example, when the codeword of additional information is accessed, then SEC may be used, and when the data codeword is accessed SECDED may be used.

There may be a latency time tCCD_L_WR which is part of the design specification of the memory. The time tCCD_L_WR represents a minimum amount of time which must elapse before a bank in the same bank group can be accessed again. The time tCCD_L_WR represents a long column-to-column (or command) delay period for writes which maybe a specification of the memory. During a write operation when additional information is enabled, the write operation may incur a latency of 2×tCCD_L_WR since each access pass requires a delay of tCCD_L_WR before the bank can be accessed again. One tCCD_L_WR is incurred from adding an extra pass to overwrite the metadata, and an additional tCCD_L_WR is incurred because in order to generate parity bits, which are based off of all of the prefetched data in this mode, the half of the prefetched data bits which are not being written must still be prefetched (e.g., read) so that they can be added to the write bits received from the controller.

Figure 3:
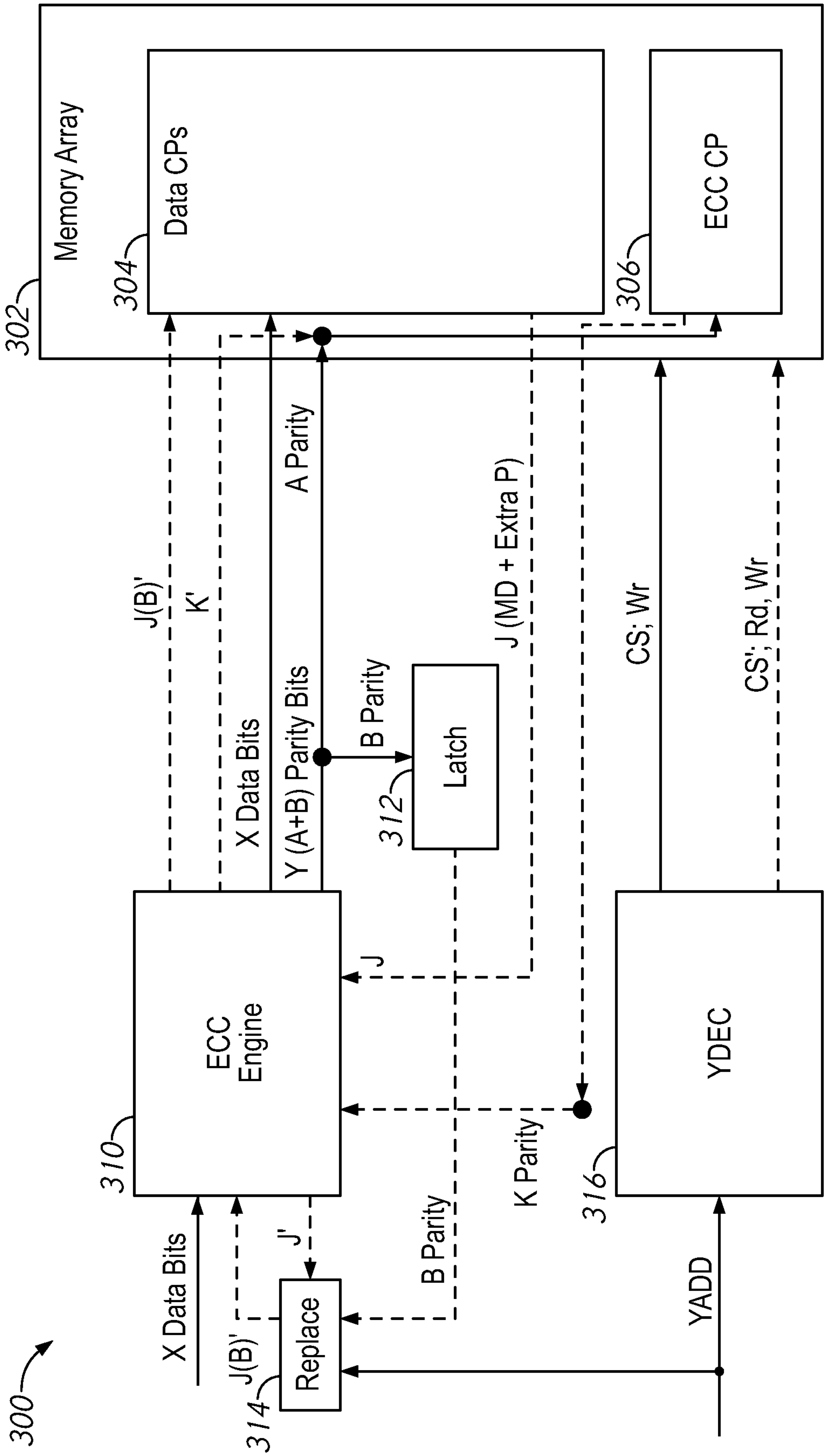
FIG. 3 is a block diagram of a write operation according to some embodiments of the present disclosure.
Figure 4:
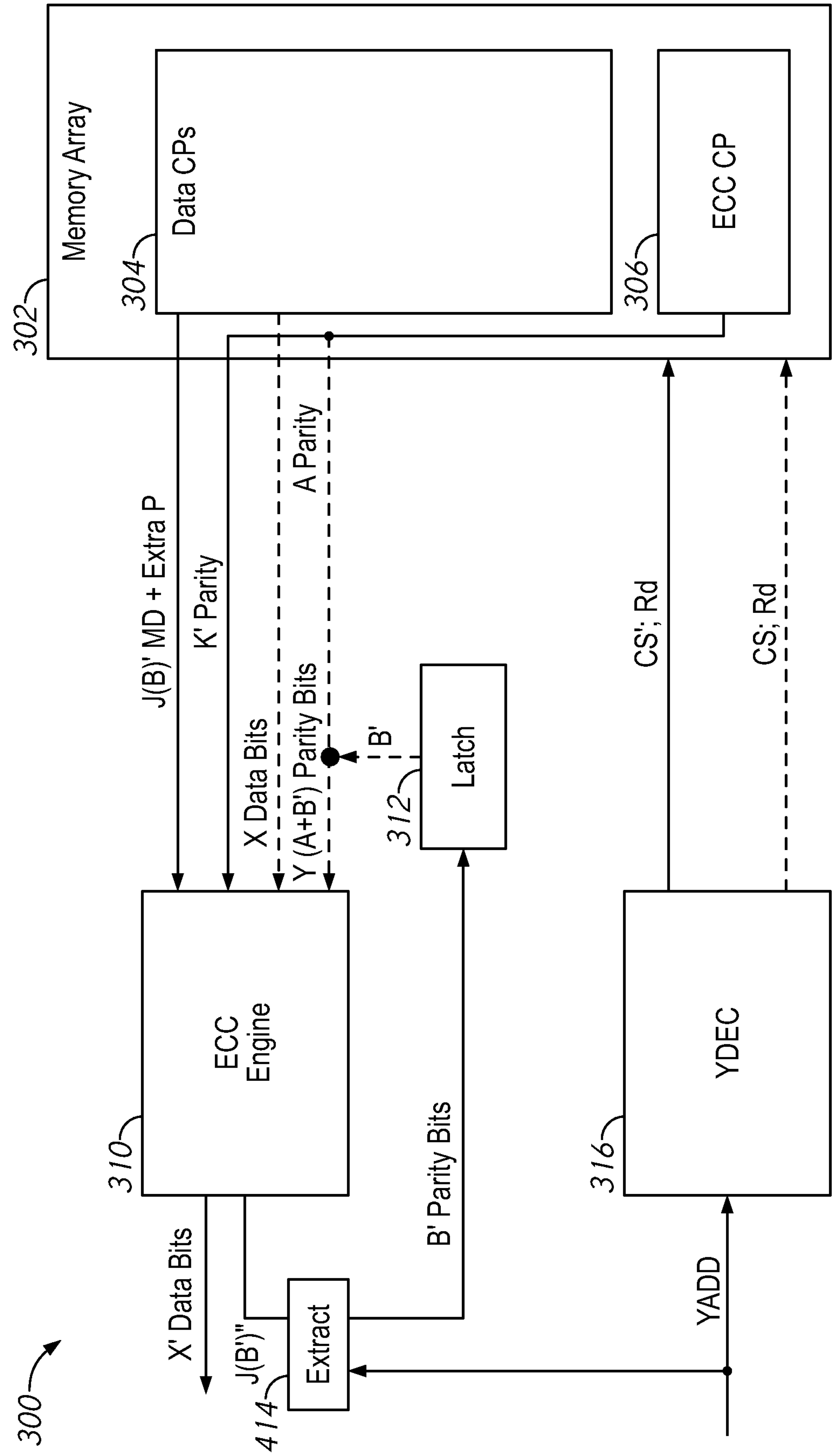
FIG. 4 is a block diagram of a read operation according to some embodiments of the present disclosure.

FIGS. 3 and 4 show a block diagram which represents example write and read operations respectively when additional information including extra parity bits are enabled. The two Figures represent a simplified view of the flow of information during a first and second access pass, both of which are performed responsive to a single access operation on the memory (e.g., both passes are responsive to the same addresses and command provided by the controller). In both FIGS. 3 and 4, a solid line indicates a first access pass, while a dotted line indicates a second access pass. For the sake of brevity, since certain components of FIGS. 3 and 4 may generally be similar to each other, they may not be described in detail with respect to both Figures.

FIG. 3 is a block diagram of a write operation according to some embodiments of the present disclosure. The Figures shows a memory device 300, which in some embodiments may implement a portion the memory device 100 of FIGS. 1 and/or 200 of FIG. 2. For example, the memory device 300 includes a memory array 302 (e.g., 118 of FIG. 1) which includes data column planes 304 (e.g., 210 of FIG. 2) and an ECC column plane 306 (e.g., 212 of FIG. 2). Also included are an ECC engine 310 (e.g., 120 of FIGS. 1 and/or 232 of FIG. 2) and a column decoder YDEC 316 (e.g., 110 of FIG. 1).

As part of the write operation, the memory receives (e.g., from a controller) X data bits (e.g., 128 data bits) along with a row and column address and a write command. The X data bits are provided to the ECC engine, which generates Y parity bits based on the X data bits. The Y parity bits include A default bits and B extra parity bits. For example, there may be X=128 data bits, which are used to generate 9 parity bits (e.g., A=8 and B=1).

The Y parity bits are split into two portions, a first portion including the default parity bits A, and a second portion including the B extra parity bits. The B extra parity bits are stored in latch 312.

As part of a first access pass, the column decoder 316 provides a first column select signal CS along with a write command Wr to the memory array. The X data bits are written to data column planes 304, and the first portion of the parity bits which includes the A default parity bits is written to the ECC column plane 306.

As part of a second access pass, the memory 300 performs a read/modify/write (RMW) operation on a codeword of additional information which will be modified to include the second portion of the parity bits including the B extra parity bits. As part of the RMW operation, the column decoder provides a second column select signal based on the column address YADD along with a read command. A codeword of additional information including J bits is read out from the data column planes 304, and K parity bits associated with the J additional information bits is read out from the ECC CP 306. In some embodiments, J may generally be equal to X, and K may generally be equal to A. For example, there may be J=128 additional information bits and K=8 parity bits associated with the additional information codeword.

The J additional information bits and K parity bits are read out to the ECC engine 310, which checks for errors in the J additional information bits based on the K parity bits. For example, the ECC engine 310 may perform SEC on the J additional information bits and provide corrected additional information J'. The corrected additional information J' is provided to a logic circuit 314, which performs the modify part of the RMW operation. The logic circuit 314 replaces one or more bits of the corrected additional information J' with the extra parity bits B stored in the latch 312. This may generate modified additional information J(B)'. For example, if B=1 bit, then one bit of the 128 bits of J' may be replaced with the value of the extra parity bit B. The logic 314 may choose which bit of J' to replace based on the column address (and/or a signal such as CS' based on the column address).

As the write part of the RMW operation, the ECC engine 310 receives the modified additional information J(B)' and generates updated parity K' based on that modified additional information J(B)'. The column decoder then provides a write command Wr (along with the second CS signal CS') to the memory array 302, and the modified additional information J(B)' is written to the data column planes 304 and the updated parity K' is written to the ECC CP 306. In this manner the first portion of the parity (the default parity bits A) is written to the ECC CP 306 and the second portion of the parity (the extra parity bits B) are written to the data CPs 304.

If metadata is enabled on top of the extra parity bits, then as part of the write operation, the memory 300 may receive M metadata bits along with the X data bits. The ECC engine 310 may generate the Y parity bits based on the X data bits and the M metadata bits, and then both the B extra parity bits and the M metadata bits may be stored in the latch 312. During the second access pass, the corrected additional information may be modified to include both the B parity bits and the M metadata bits.

FIG. 4 is a block diagram of a read operation according to some embodiments of the present disclosure. FIG. 4 shows the memory device 300 of FIG. 3, but this time an example read operation is shown which is used to retrieve the information which was stored as part of the write operation described with respect to FIG. 3. For the sake of consistency, the same reference numbers are used as were used in FIG. 3, and details and descriptions already described with respect to FIG. 3 will not be repeated again for the sake of brevity.

As part of a read operation, the memory 300 receives a read command along with addresses including row and column addresses. Similar to the write operation described with respect to FIG. 3, a two-pass access may be performed. The first access pass is a read to retrieve the codeword of additional information J(B)' which may be the modified codeword which includes the extra parity bits B. The column decoder provides the second column select signal CS' along with a read command Rd. The modified codeword of additional information J(B)' is read out from the data CPs 304 and the updated K' parity bits associated therewith are read out from the ECC CP 306. The ECC engine corrects the J(B)' bits based on the K' parity bits (e.g., by performing SEC) to generate corrected modified additional information J(B')".

A logic circuit 414 extracts the corrected extra parity bits B' from the corrected modified additional information J(B')". For example, the logic circuit 414 may use the row address, or one or more signals derived therefrom (e.g., CS') to determine which bits of J(B')" are B'. In some embodiments, the logic circuit 414 may be the same as the logic circuit 314 of FIG. 3. The extracted corrected extra parity bits B' are stored in latch 312, As part of a second access pass, the column decoder 316 provides the first column select signal CS along with a read command. Responsive to this, the X data bits are read out from the data CPs 304 and the default A parity bits are read out from the ECC CP 306. The A parity bits are joined with the B' parity bits stored in the latch 312 to reform the Y parity bits (e.g., A+B'). The ECC engine 310 receives the X data bits and the Y parity bits and detects and/or corrects errors based on that information. For example, the ECC engine 310 may perform SECDED on the data based on the parity Y. The ECC engine 310 provides corrected data X', which is provided to the controller. In some embodiments, if the ECC engine 310 corrects an error and/or if the ECC engine detects an error it cannot correct (e.g., a double bit error), it will provide a signal indicating that an error was detected.

Figure 5:
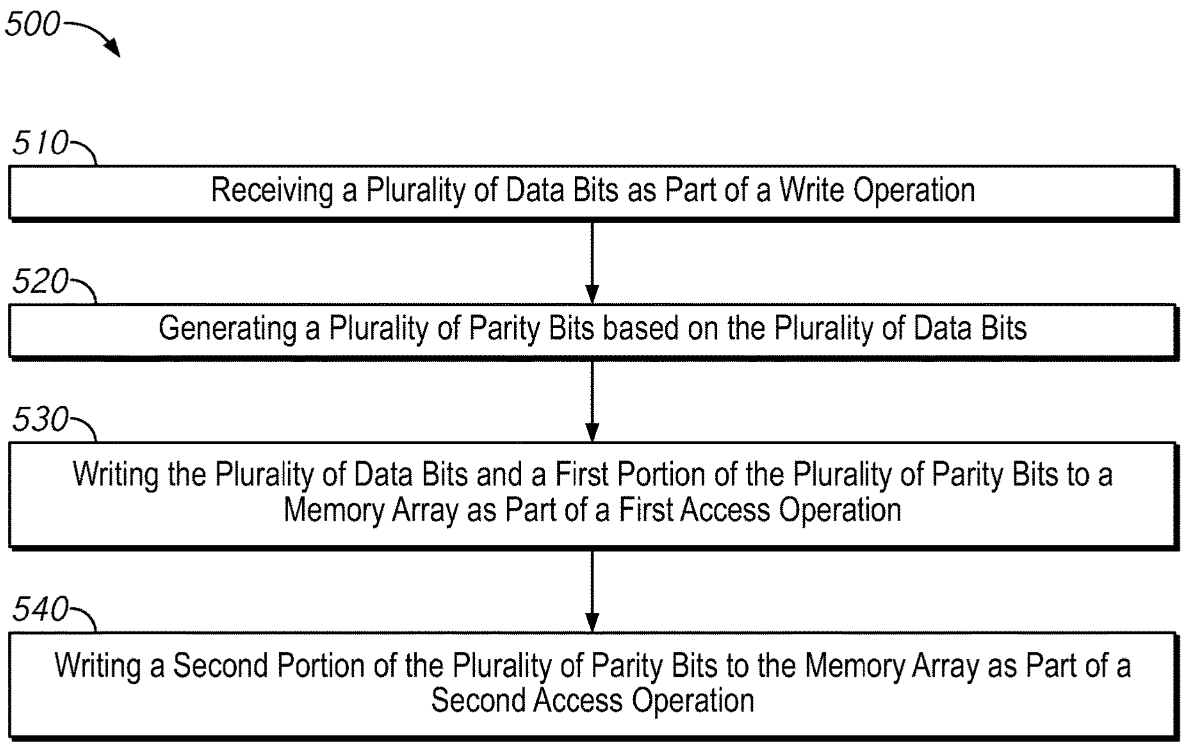
FIG. 5 is a flow chart of a method of writing data, default parity, and extra parity according to some embodiments of the present disclosure.

FIG. 5 is a flow chart of a method of writing data, default parity, and extra parity according to some embodiments of the present disclosure. The method 500 may, in some embodiments, be implemented by one or more of the systems or apparatuses described herein. For example, the method 500 may be performed by the memory 100 of FIG. 1 or 200 of FIG. 2, and may represent the operation of the memory 300 described in FIG. 3.

The method 500 may generally begin with box 510, which describes receiving a plurality of data bits as part of a write operation. The method 500 may include receiving the data bits from a controller at DQ terminals of the device. The method 500 may also include receiving a write command as well as row and column address from the controller as part of the write operation.

Box 510 may generally be followed by box 520, which describes generating a plurality of parity bits based on the plurality of data bits (e.g., with an ECC circuit such as 120 of FIG. 1, 232 of FIG. 2, and/or 310 of FIGS. 3-4). The plurality of parity bits may include a number of default bits and a number of extra bits. The method 500 may include specifying a number of extra bits based on a setting of the memory, such as a register in a mode register (e.g., 130 of FIG. 1). The method 500 may include performing a mode register write operation to the memory to specify the number of extra bits. If the specified number is zero (e.g., the extra parity bits are disabled) then instead of proceeding to boxes 530 and 540, the method 500 includes writing the plurality of data bits to data column planes (e.g., 210 of FIGS. 2 and/or 304 of FIGS. 3-4) and writing the plurality of parity bits to an ECC column plane (e.g., 212 of FIGS. 2 and/or 306 of FIGS. 3-4). If the specified number of extra parity bits is one or more, then the method 500 may proceed to box 530.

Box 530 describes writing the plurality of data bits and a first portion of the plurality of parity bits to a memory array as part of a first access operation. For example, the first portion may include the default parity bits. The first access operation may include providing a first column select signal based on a column address, and writing the data bits to memory cells along a word line at the columns specified by the column select address in data column planes (e.g., 210 of FIGS. 2 and/or 304 of FIGS. 3-4) and writing the first portion of the plurality of parity bits along the word line at the columns specified by the column select address in an ECC column plane (e.g., 212 of FIGS. 2 and/or 306 of FIGS. 3-4).

Box 530 may be followed by box 540, which describes writing a second portion of the plurality of parity bits to the memory array as part of a second access operation. The method 500 includes writing the second portion of the plurality of parity bits (e.g., the extra parity bits) to the data column planes. For example, the method 500 may include providing a second column select signal (different than the first) based on the column address and writing the second portion of the plurality of parity bits along the word line at columns specified by the second column select signal in the data column planes. The second column select signal may access columns which are set aside for additional information. The method 500 may include reserving the columns for additional information if one or more bits of additional information are specified in the settings of the memory device (e.g., in the mode register). Otherwise those columns may be used as addressable memory space.

The second access operation may follow the first access operation. The method 500 may include storing the second portion of the plurality of parity bits while the data and the first portion are being written. The first access operation may be a write operation, while the second access operation is a read/modify/write operation. During the RMW operation, the method 500 may include reading a codeword of additional information, modifying the codeword to include the second portion of the plurality of parity bits and writing the modified codeword back to the memory array.

Figure 6:
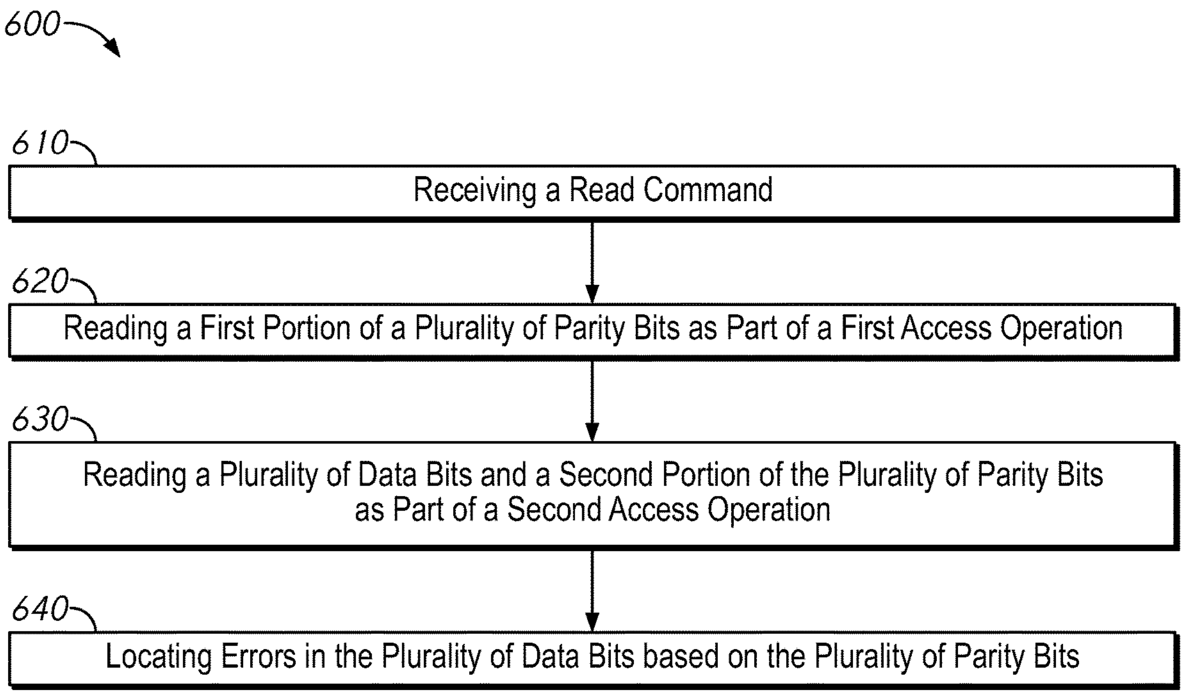
FIG. 6 is a flow chart of a method of reading data, default parity, and extra parity according to some embodiments of the present disclosure.

FIG. 6 is a flow chart of a method of reading data, default parity, and extra parity according to some embodiments of the present disclosure. The method 600 may, in some embodiments, be implemented by one or more of the systems or apparatuses described herein. For example, the method 500 may be performed by the memory 100 of FIG. 1 or 200 of FIG. 2, and may represent the operation of the memory 300 described in FIG. 4. The method 600 may be used to retrieve data, such as the data written based on the write operation described in FIG. 5. For the sake of brevity, certain operations described with respect to FIG. 5, such as enabling extra parity with a mode register, are not repeated with respect to FIG. 6.

The method 600 includes box 610 which describes receiving a read command. Similar the write command of box 510 of FIG. 5, the method 600 may include receiving a read command along with a row and column address from a controller (e.g., 150 of FIG. 1).

Box 610 may be followed by box 620 which describes reading a first portion of the parity bits as part of a first access operation. The first portion may be the extra parity bits (e.g., the second portion described with respect to FIG. 5). The first access operation may include reading a codeword of additional information from data column planes of the memory and extracting the extra parity bits. The method 600 may include providing the second column select signal value (e.g., as described in FIG. 5) to access the reserved columns where the codeword of additional information is stored. The method 600 may include storing the extra parity bits.

Box 620 may generally be followed by box 630 which describes reading a plurality of data bits and a second portion of the plurality of parity bits (e.g., the default parity bits, referred to as the first portion of the plurality of parity bits with respect to FIG. 5) as part of a second access operation. The second access operation may follow the first access operation. Assuming that the read operation of FIG. 6 is reading the data written in FIG. 5, the second access operation includes providing the first column select signal (of FIG. 5) and reading the data bits from columns along the word line in the data column planes and reading the second portion of the plurality of parity bits from an ECC column plane. The method 600 may include joining the parity bits and the extra parity bits.

Box 630 may generally be followed by box 640, and describes locating errors in the plurality of data bits based on the plurality of parity bits. For example, the method 600 may include performing SECDED when the extra parity bits are enabled (and performing SEC when they are not).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:

an error correction code (ECC) circuit configured to receive a plurality of data bits and generate a plurality of parity bits as part of a write operation;

a memory array comprising a plurality of data column planes and an ECC column plane, wherein a first portion of the plurality of parity bits are written to the ECC column plane and wherein the plurality of data bits and a second portion of the plurality of parity bits are written to the plurality of data column planes; and a mode register comprising a setting which specifies a size of the second portion of the plurality of parity bits.

2. The apparatus of claim 1, wherein the plurality of data bits are written to the plurality of data column planes and the first portion of the plurality of parity bits are written to the ECC column plane as part of a first access pass on the memory array and wherein the second portion of the plurality of parity bits are written to the plurality of data column planes as part of a second access pass on the memory array.

3. The apparatus of claim 1, wherein the mode register comprising a second setting which specifies a number of a plurality of metadata bits, wherein the specified number of the plurality of metadata bits are written to the plurality of data column planes with the second portion of the plurality of parity bits.

4. The apparatus of claim 1, wherein as part of a read operation the error correction code circuit is configured to perform single error correction, double error detection (SECDED) based on the plurality of data bits and the plurality of parity bits.

5. An apparatus comprising:

an error correction code (ECC) circuit configured to receive a plurality of data bits and generate a plurality of parity bits as part of a write operation; and a memory array comprising a plurality of data column planes and an ECC column plane, wherein a first portion of the plurality of parity bits are written to the ECC column plane and wherein the plurality of data bits and a second portion of the plurality of parity bits are written to the plurality of data column planes, wherein the plurality of data bits are written to the plurality of data column planes and the first portion of the plurality of parity bits are written to the ECC column plane as part of a first access pass on the memory array and wherein the second portion of the plurality of parity bits are written to the plurality of data column planes as part of a second access pass on the memory array, and wherein the second access pass is a read/modify/write operation on a codeword of additional information stored in the plurality of data column planes.

6. An apparatus comprising:

an error correction code (ECC) circuit configured to receive a plurality of data bits and generate a plurality of parity bits as part of a write operation;

a memory array comprising a plurality of data column planes and an ECC column plane, wherein a first portion of the plurality of parity bits are written to the ECC column plane and wherein the plurality of data bits and a second portion of the plurality of parity bits are written to the plurality of data column planes, wherein the plurality of data bits are written to the plurality of data column planes and the first portion of the plurality of parity bits are written to the ECC column plane as part of a first access pass on the memory array and wherein the second portion of the plurality of parity bits are written to the plurality of data column planes as part of a second access pass on the memory array; and a column decoder configured to provide a first value of a column select signal as part of the first access pass and a second value of the column select signal as part of the second access pass.

7. An apparatus comprising:

a memory array;

a mode register comprising a setting which specifies a number of extra parity bits;

an error correction code (ECC) circuit configured to provide a plurality of default parity bits and the specified number of extra parity bits as part of a write operation, wherein the plurality of default parity bits are written to the memory array as part of a first access pass, and wherein the specified number of extra parity bits are written to the memory array as part of a second access pass.

8. The apparatus of claim 7, further comprising a latch configured to store the specified number of extra parity bits.

9. The apparatus of claim 7, further comprising a column decoder configured to provide a first value of a column select signal during the first access pass and a second value of the column select signal during a second access pass.

10. The apparatus of claim 7, wherein the second access pass is a read/modify/write operation.

11. The apparatus of claim 7, wherein the ECC circuit is configured to receive the plurality of default bits and the specified number of extra bits as part of a read operation, wherein the specified number of extra parity bits are read from the memory array as part of a first access pass, and wherein the plurality of default parity bits are read from the memory array as part of a second access pass.

12. The apparatus of claim 11, wherein the ECC circuit is also configured to receive a plurality of data bits and configured to perform single error correction, double error detection (SECDED) on the plurality of data bits based on the plurality of default parity bits and the specified number of extra bits when the specified number is one or two.

13. The apparatus of claim 7, wherein if the specified number is zero, then the second access pass is skipped.

14. A method comprising:

receiving a plurality of data bits as part of a write operation;

generating a plurality of parity bits based on the plurality of data bits;

writing the plurality of data bits and a first portion of the plurality of parity bits to a memory array as part of a first access pass; and writing a second portion of the plurality of parity bits to the memory array as part of a second access pass based on a mode register setting.

15. A method comprising:

receiving a plurality of data bits as part of a write operation;

generating a plurality of parity bits based on the plurality of data bits;

writing the plurality of data bits and a first portion of the plurality of parity bits to a memory array as part of a first access pass;

writing a second portion of the plurality of parity bits to the memory array as part of a second access pass writing the plurality of data bits and the first portion of the plurality of parity bits based on a first value of a column select signal; and writing the second portion of the plurality of parity bits based on a second value of a column select signal.

16. A method comprising:

receiving a plurality of data bits as part of a write operation;

generating a plurality of parity bits based on the plurality of data bits;

writing the plurality of data bits and a first portion of the plurality of parity bits to a memory array as part of a first access pass;

writing a second portion of the plurality of parity bits to the memory array as part of a second access pass; and performing a read/modify/write operation as part of the second access pass.

17. A method comprising:

receiving a plurality of data bits as part of a write operation;

generating a plurality of parity bits based on the plurality of data bits;

writing the plurality of data bits and a first portion of the plurality of parity bits to a memory array as part of a first access pass;

writing a second portion of the plurality of parity bits to the memory array as part of a second access pass;

reading the second portion of the plurality of parity bits from the memory array as part of a third access pass as part of a read operation;

reading the plurality of data bits and the first portion of the plurality of parity bits from the memory array as part of a fourth access pass as part of the read operation; and detecting errors, correcting errors, or combinations thereof in the plurality of data bits based on the plurality of data bits and the plurality of parity bits.

18. The method of claim 17, further comprising performing single error correction, double error detection on the plurality of data bits.

* * * * *